US010686109B2

(12) United States Patent
Vakkalanka et al.

(10) Patent No.: US 10,686,109 B2
(45) Date of Patent: Jun. 16, 2020

(54) LED PACKAGE USING ELECTROFORM STENCIL PRINTING

(71) Applicant: Lumileds LLC, San Jose, CA (US)

(72) Inventors: Sridevi A. Vakkalanka, Campbell, CA (US); S. Rao Peddada, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/851,401

(22) Filed: Dec. 21, 2017

(65) Prior Publication Data
US 2018/0190889 A1 Jul. 5, 2018

Related U.S. Application Data

(60) Provisional application No. 62/440,930, filed on Dec. 30, 2016.

(30) Foreign Application Priority Data

Mar. 20, 2017 (EP) .................................... 17161845

(51) Int. Cl.
*H01L 33/62* (2010.01)
*H01L 33/60* (2010.01)
(Continued)

(52) U.S. Cl.
CPC ............ *H01L 33/62* (2013.01); *B23K 1/0016* (2013.01); *B23K 3/0638* (2013.01); *B23K 31/02* (2013.01);
(Continued)

(58) Field of Classification Search
CPC ..... H01L 33/483; H01L 33/486; H01L 33/60; H01L 33/62; H01L 2933/0033;
(Continued)

(56) References Cited

U.S. PATENT DOCUMENTS 6,722,275 B2 * 4/2004 Coleman .............. H05K 3/1225
101/127
9,397,278 B2 7/2016 Oh et al.
(Continued)

FOREIGN PATENT DOCUMENTS

DE 102014102259 A1 8/2015
EP 1411557 4/2004

OTHER PUBLICATIONS

Coleman, "Two Print Stencils Systems," As originally published in the IPC APEX EXPRO Conference Proceedings (Feb. 21, 2013).
(Continued)

*Primary Examiner* — Andrew Q Tran
(74) *Attorney, Agent, or Firm* — Volpe and Koenig, P.C.

(57) ABSTRACT

A method for manufacturing light emitting devices, comprising: providing a package body including: (i) a reflector cup defining a cavity and (ii) a plurality of metal pads disposed at a bottom surface of the cavity; performing reservoir stencil printing to deposit a respective solder pattern on each of the metal pads, the reservoir stencil printing being performed using a 3D electroform stencil that is placed over the reflector cup, the 3D electroform stencil including a lip configured to engage one or more sidewalls of the reflector cup, and a reservoir extending away from the lip and into the cavity; placing an LED die on the solder patterns that are formed on the metal pads and performing reflow soldering to attach the LED die to the metal pads.

9 Claims, 8 Drawing Sheets

(51) Int. Cl.
*B23K 31/02* (2006.01)
*H01L 33/48* (2010.01)
*B23K 3/06* (2006.01)
*B23K 1/00* (2006.01)

(52) U.S. Cl.
CPC ............ *H01L 33/486* (2013.01); *H01L 33/60* (2013.01); *H01L 2933/0033* (2013.01); *H01L 2933/0066* (2013.01)

(58) Field of Classification Search
CPC .......... H01L 2933/0066; B23K 1/0016; B23K 3/0638; B23K 31/02
See application file for complete search history.

(56) References Cited

U.S. PATENT DOCUMENTS

| | | | |
|---|---|---|---|
| 9,831,407 B2* | 11/2017 | Oh | H01L 33/60 |
| 10,256,385 B2* | 4/2019 | Britt | H01L 33/62 |
| 2003/0061948 A1 | 4/2003 | Coleman et al. | |
| 2012/0187862 A1 | 7/2012 | Britt et al. | |
| 2015/0200336 A1 | 7/2015 | Bhat et al. | |
| 2016/0172558 A1 | 6/2016 | Liu | |
| 2016/0293811 A1 | 10/2016 | Hussell et al. | |
| 2016/0300988 A1 | 10/2016 | Oh et al. | |
| 2016/0322549 A1 | 11/2016 | Butterworth | |

OTHER PUBLICATIONS

Cabahug et al., "Solder Stencil Printing on Deep Cavity," 2008 10th Electronics Packaging Technology Conference, Singapore, pp. 683-688 (2008).

* cited by examiner

LED PACKAGE USING ELECTROFORM STENCIL PRINTING

FIELD OF INVENTION

The present disclosure relates to light emitting diodes (LEDs), in general, and more particularly, to an LED package using electroform stencil printing.

BACKGROUND

Light emitting diodes ("LEDs") are commonly used as light sources in various applications. The main functional part of an LED may be a semiconductor chip comprising two injecting layers of opposite conductivity types (p-type and n-type), and a light-emitting active layer for radiative recombination in which injection of carriers takes place. The semiconductor chip is usually placed in a package that provides electrical connections between the LED chip and the outside world, in addition to protection against vibration, mechanical shock, and overheating. The protection provided by LED packaging against vibration, mechanical shock, and overheating is essential with respect to the reliable operation LED-based light emitting devices.

SUMMARY

According to aspects of the disclosure, a method is disclosed for manufacturing light emitting devices, comprising: providing a package body including: (i) a reflector cup defining a cavity and (ii) a plurality of metal pads disposed at a bottom surface of the cavity; performing reservoir stencil printing to deposit a respective solder pattern on each of the metal pads, the reservoir stencil printing being performed using a 3D electroform stencil that is placed over the reflector cup, the 3D electroform stencil including a lip configured to engage one or more sidewalls of the reflector cup, and a reservoir extending away from the lip and into the cavity; placing an LED die on the solder patterns that are formed on the metal pads and performing reflow soldering to attach the LED die to the metal pads.

BRIEF DESCRIPTION OF THE DRAWINGS

The drawings described below are for illustration purposes only. The drawings are not intended to limit the scope of the present disclosure. Like reference characters shown in the figures designate the same parts in the various embodiments.

DETAILED DESCRIPTION

Figure 1A:
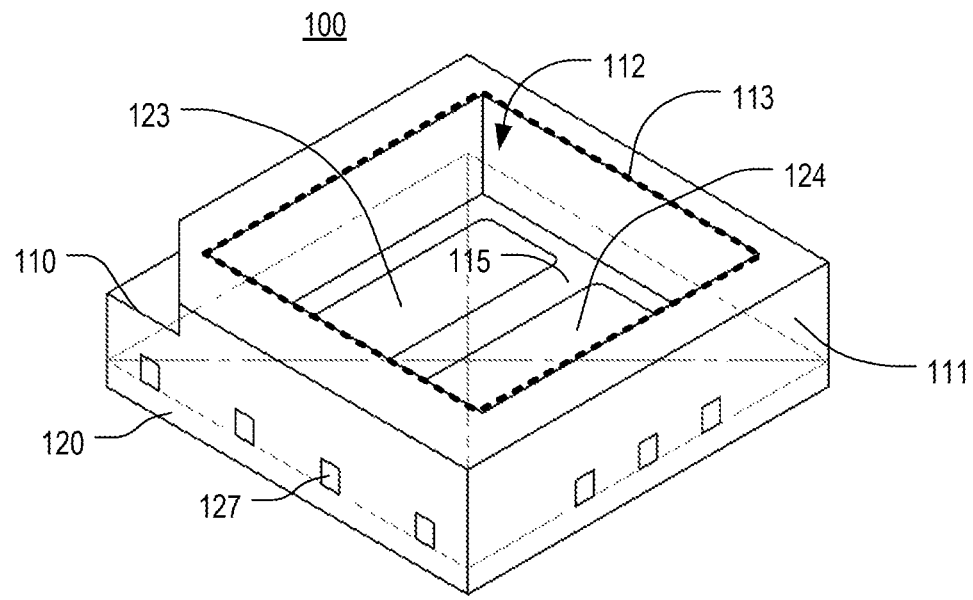
FIG. 1A is a top-down perspective view of an example of an LED package body, according to aspects of the disclosure.

According to aspects of the disclosure, an improved LED package is disclosed that is suitable for use in automotive lighting applications. The LED package may include an undersized reflector cup and an LED die that is attached to the package's contacts with gold-tin solder. The reflector cup may have an opening that is at most 30% larger than a footprint of the LED die, which may permit the LED package to fit in constrained spaces, such as those found inside automotive headlights. The use of gold-tin solder may further render the LED package suitable for use in automotive applications, as gold-tin solder generally has a high melting point which may prevent it from melting when exposed to the thermal conditions normally present inside automotive headlights.

According to aspects of the disclosure, a method for manufacturing the improved LED package is disclosed in which a 3-dimensional (3D) electroform stencil is used to deposit the gold-tin solder. When the 3D electroform stencil is used, the reservoir of the 3D electroform stencil may be inserted inside the reflector cup and filled with solder paste. Afterwards, the solder paste may be driven through apertures at the bottom of the 3D electroform stencil to deposit a respective solder pattern onto each of a plurality of metal pads that are exposed on the interior bottom surface of the reflector cup. In some aspects, using the 3D electroform stencil may be necessary when gold-tin solder is used in order to prevent bridging between the solder patterns.

Bridging between two solder patterns may occur when the solder paste used to form one solder pattern flows into the other solder pattern to create a short circuit. The use of the 3D electroform stencil discussed above may ensure that gold-tin solder paste can be deposited in sufficient quantities and with sufficient precision to prevent bridging. Furthermore, the use of the 3D electroform stencil discussed above may be preferable over dispensing gold-tin solder paste directly into the reflector cup of the improved LED package, as the physical properties of the gold-tin solder paste could make it prone to bridging when direct dispensation is used.

According to aspects of the disclosure, a light emitting device is disclosed, comprising: a reflector cup coupled to a base to define a cavity, the base including a plurality of metal pads exposed on a bottom surface of the cavity, and the base further including a plurality of protrusions arranged around a perimeter of the base and disposed inside one or more sidewalls of the reflector cup; and an LED die disposed over the bottom surface of the cavity, the LED die being coupled to the metal pads using gold-tin solder, the LED die having a footprint that is at most 30% smaller than an area of a top opening of the cavity.

Examples of LED packages, and methods for manufacturing the same, will be described more fully hereinafter with reference to the accompanying drawings. These examples are not mutually exclusive, and features found in one example can be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that these terms are intended to encompass different orientations of the element in addition to any orientation depicted in the figures.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

FIG. 1A is a perspective view of an example of a light emitting diode (LED) package body 100, according to aspects of the disclosure. The LED package body 100 may include a reflector cup 110 that is molded over a metal base 120, as shown. In some implementations, the reflector cup 110 may be formed of an epoxy molding compound (EMC). Additionally or alternatively, in some implementations, the reflector cup 110 may be formed of a reflective silicone molding compound (SMC), as SMC is capable of withstanding higher processing temperatures and is more reflective than EMC. Although in the present example the reflector cup 110 is formed of either SMC or EMC, alternative implementations are possible in which another material is used. The present disclosure is thus not limited to any specific material for forming the reflector cup 110.

As illustrated in FIG. 1A, the reflector cup 110 may include one or more sidewalls 111 that are arranged to define a cavity 112. The cavity 112 may have a top opening 113 (denoted by a dashed rectangle) and a bottom surface defined at least in part by the base 120. Furthermore, the reflector cup 110 may include a bridge member 115 that extends across the bottom of the cavity 112. In some implementations, the bridge member 115 may be formed of a dielectric material and disposed between metal pads 123 and 124 of the base 120 to electrically insulate the metal pads 123 and 124 from one another. Each of the metal pads 123 and 124 may be at least partially exposed on the interior bottom surface of the cavity 112 of the reflector cup 110 so that electrical connections can be formed between the metal pads 123 and 124 and the electrodes of an LED die that is subsequently inserted into the reflector cup 110.

Figure 1B:
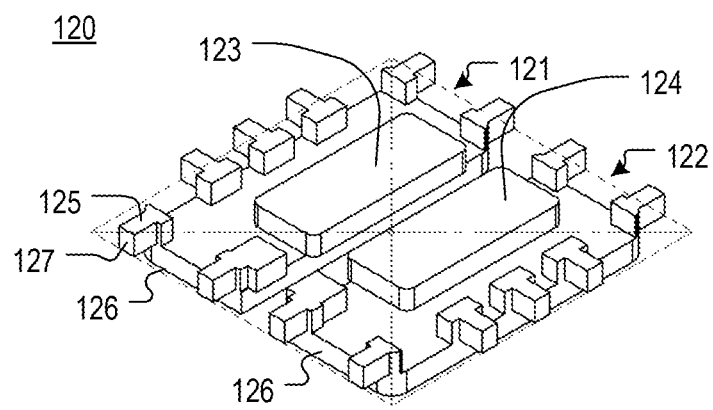
FIG. 1B is a top-down perspective view of an example of a metal base that is part of the LED package body of FIG. 1A, according to aspects of the disclosure.

FIG. 1B is perspective top-down view of the base 120, according to aspects of the disclosure. As illustrated, the base 120 may include a portion 121 and a portion 122. Portion 121 may include the metal pad 123 and a plurality of protrusions 125 that are arranged on the outer edges 126 of the metal pad 123. Portion 122 may include the metal pad 124 and another plurality of protrusions 125 that are arranged on the outer edges 126 of the metal pad 124. In some implementations, the protrusions 125 may overhang the outer edges 126, as shown. When the reflector cup 110 is molded over the base 120, the protrusions 125 may be engulfed by the molding compound used to make the reflector cup 110, thereby ensuring a strong grip of the molding compound over the base 120. Moreover, as illustrated in FIG. 1A, the outer surfaces 127 of the protrusions 125 may be exposed on the sidewalls 111 of the reflector cup 110.

Figure 2A:
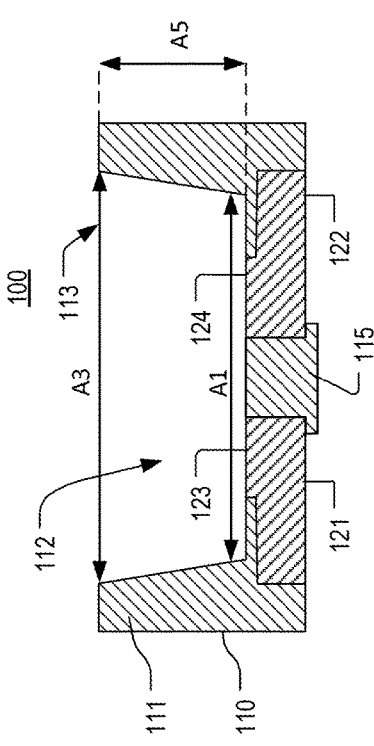
FIG. 2A is a cross-sectional side view of the LED package body of FIG. 1A, according to aspects of the disclosure.
Figure 2B:
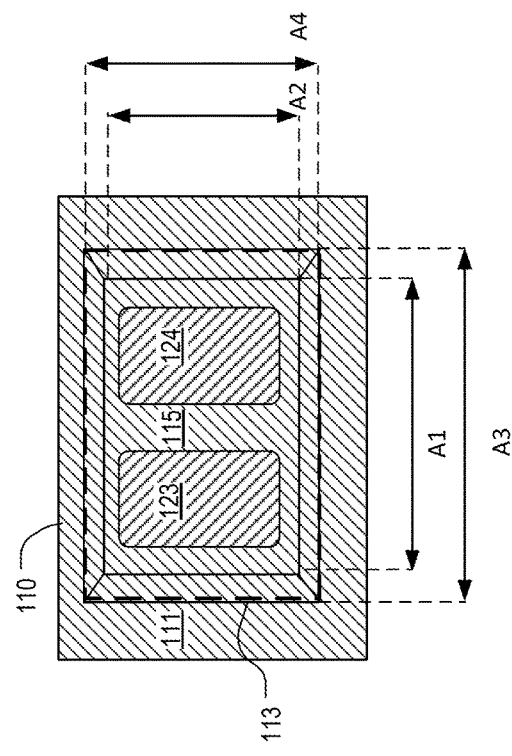
FIG. 2B is a top-down view of the LED package body of FIG. 1A, according to aspects of the disclosure.

FIG. 2A is a cross-sectional side view of the LED package body 100 and FIG. 2B is a top-down view of the LED package body 100, according to aspects of the disclosure. As illustrated in FIGS. 2A-B, the cavity 112 of the reflector cup 110 may have a trapezoidal cross-section. The bottom surface of the cavity 112 may have a width A1 and length A2 and the top opening 113 of the cavity 112 may have a width A3 and length A4. Moreover, in some implementations, the cavity 112 may have a depth A5 of 4 mm or less.

In the present example, the cavity 112 of the reflector cup 110 has a trapezoidal cross-section. However, alternative implementations are possible in which the cavity 112 has a rectangular cross-section. Although in the present example the width A1 of the bottom surface of the cavity 112 is smaller than the width A3 of the top opening 113 of the cavity 112, alternative implementations are possible in which the width A1 of the bottom surface of the cavity 112 is greater than or equal to the width A3 of top the top opening 113 of the cavity 112. Furthermore, although in the present example, the length A2 of the bottom surface of the cavity 112 is smaller than the length A4 of the top opening 113 of the cavity 112, alternative implementations are possible in which the length A2 of the bottom surface of the cavity 112 is greater than or equal to the length A4 of the top opening 113 of the cavity 112. Stated succinctly, the present disclosure is not limited to any particular set of dimensions and/or shape for the cavity 112 of the reflector cup 110.

Figure 3A:
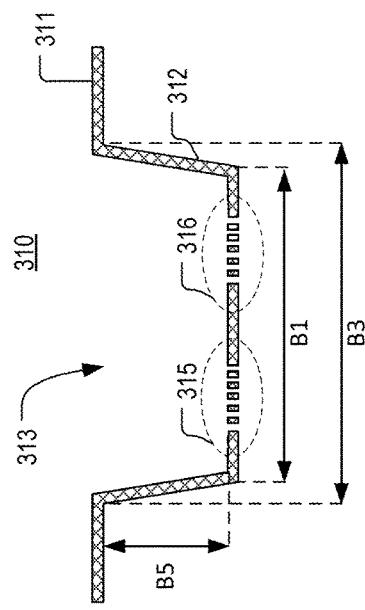
FIG. 3A is cross-sectional side view of an example of a 3D electroform stencil, according to aspects of the disclosure.

FIG. 3A is cross-sectional side view of a 3D electroform stencil 310 that can be used to print solder patterns on the metal pads 123 and 124. The 3D electroform stencil 310 may include a lip 311 and a reservoir 312. The reservoir 312 may include a first plurality of apertures 315 and a second plurality of apertures 316 formed on the bottom surface of the reservoir 312. As further discussed below, the apertures 315 and 316 may be used for releasing solder from the reservoir 312 onto the metal pads 123 and 124. In this regard, the apertures 315 may be formed in a first location on the bottom surface of the reservoir 312 that corresponds to the metal pad 123. Similarly, the apertures 316 may be formed in a second location on the bottom surface of the reservoir 312 that corresponds to the metal pad 124. According to aspects of the disclosure, a location on the bottom surface of the reservoir 312 corresponds to a metal pad disposed on the bottom interior surface of the reflector cup 110 only if that location is situated directly above the metal pad when the 3D electroform stencil 310 is inserted in the reflector cup 110.

The 3D electroform stencil 310 may be formed of nickel and/or any other suitable material that permits additive solder paste deposition with smooth sidewalls, sufficient stencil resolution, and sufficient solder paste release. In some implementations, the reservoir 312 of the 3D electroform stencil 310 may be grown from a mandrel that has been machined to match the shape of the cavity 112 of the reflector cup 110. As a result, the reservoir 312 may have a shape that matches the shape of the cavity 112. According to aspects of the disclosure, the shape of the reservoir 312 is said to match the shape of cavity 112 when the shape of the reservoir 312 permits the reservoir 312 to be inserted in the cavity 112 in a way that causes the first plurality of apertures 315 to be disposed directly above the metal pad 123, while the second plurality of apertures 316 is disposed directly above the metal pad 124. Additionally or alternatively, although not shown in FIGS. 3A-B, in some implementations, the bottom surface of the reservoir 312 may have a relief that matches the shape of the bottom surface of the reflector cup 110.

Figure 3B:
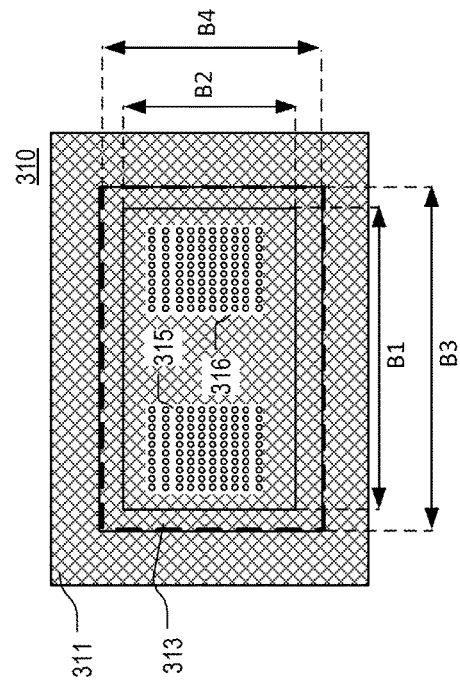
FIG. 3B is a top-down view of the 3D electroform stencil of FIG. 3A, according to aspects of the disclosure.

Although FIG. 3A depicts the reservoir 312 as having a trapezoidal cross-section, it will be understood that the reservoir 312 can have any suitable shape. As illustrated in FIGS. 3A-B, the bottom surface of the reservoir 312 may have a width B1 and length B2. Furthermore, the top opening 313 of the reservoir 312 (denoted by a dashed rectangle) may have a width B3 and length B4. In the present example, the width B3 of the top opening 313 of the reservoir 312 is larger than the width B1 of the bottom surface of the reservoir 312. However, alternative implementations are possible in which the width B1 of the bottom surface of the reservoir 312 is greater than or equal to the width B3 of the top opening 313 of the reservoir 312. Furthermore, in the present example, the length B4 of the top opening 313 of the reservoir 312 is larger than the length B2 of the bottom surface of the reservoir 312. However, alternative implementations are possible in which the length B2 of the bottom surface of the reservoir 312 is greater than or equal to the length B4 of the top opening 313 of the reservoir 312. Stated succinctly, the present disclosure is not limited to any set of dimensions and/or shape for the reservoir 312 of the 3D electroform stencil 310.

Although in the example of FIGS. 2A-B and 3A-B, the reservoir 312 of the 3D electroform stencil 310 has a shape that is conformal to the shape of the cavity 112 of the reflector cup 110, this depiction is provided for illustrative of purposes only. As can be readily appreciated, alternative implementations are possible in which the reservoir 312 has a shape that is not conformal to the shape of the cavity 112. For example, alternative implementations are possible in which the cavity 112 still has a trapezoidal cross-section while the reservoir 312 has a U-shaped cross-section.

According to the example of FIGS. 2A-B and 3A-B, the depth A5 of the cavity 112 of the reflector cup 110 is equal to the depth B5 of the reservoir 312 of the 3D electroform stencil 310. However, alternative implementations are possible in which the depth B5 of the reservoir 312 is less than the depth A5 of the cavity 112. In such instances, when the reservoir 312 is inserted into the cavity 112, the bottom surface of the reservoir 312 may sit above the bottom surface of the cavity 112, without making direct contact with the bottom surface of the cavity 112. Moreover, in some implementations, the length B5 of the reservoir 312 may be slightly larger than the length A5 of the cavity 112. Stated succinctly, the present disclosure is not limited to any specific relationship between the depth A5 of the cavity 112 of the reflector cup 110 and the depth B5 of the reservoir 312 of the 3D electroform stencil 310.

Figure 4:
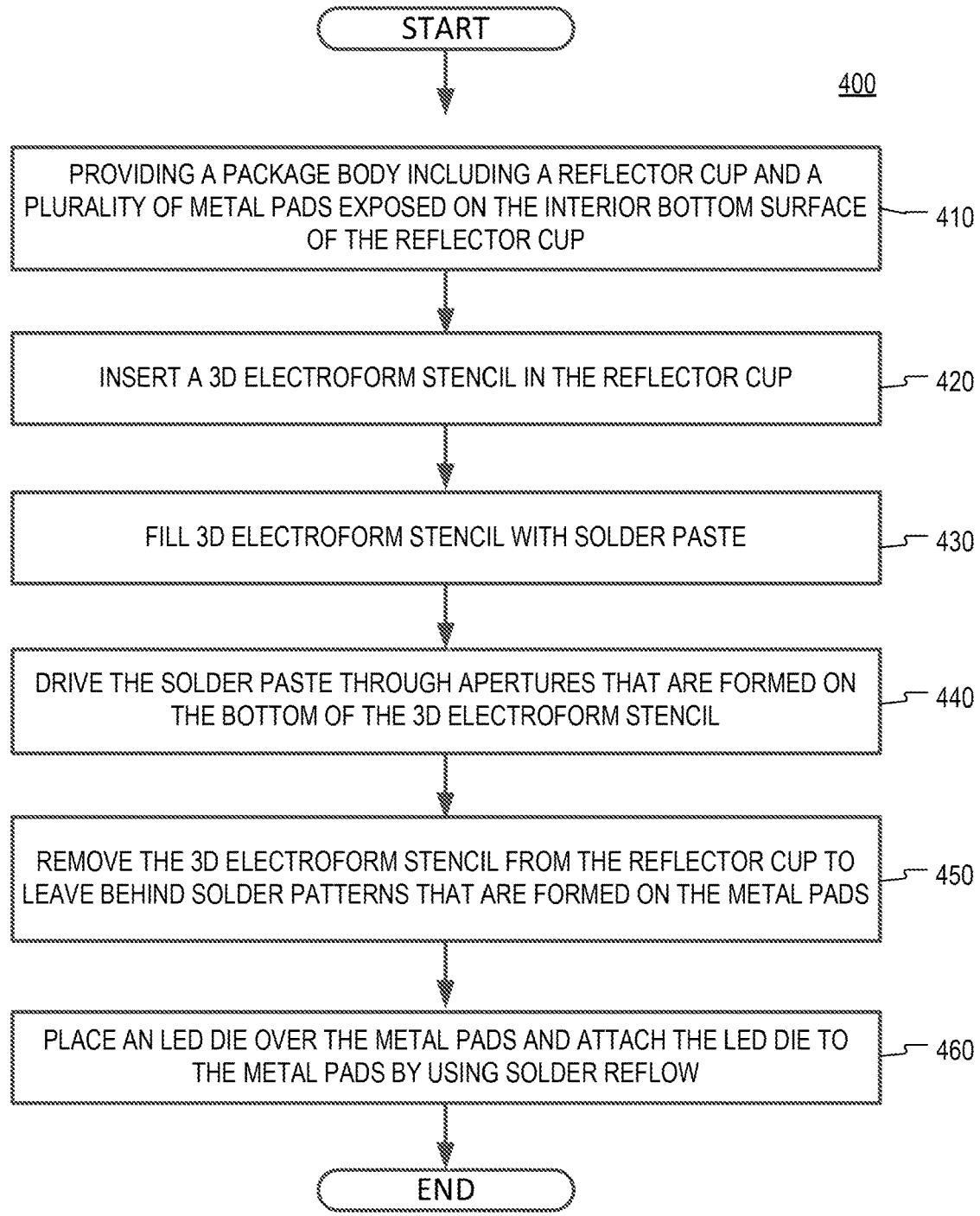
FIG. 4 is a flowchart of an example of a process for manufacturing light emitting devices, according to aspects of the disclosure.

FIG. 4 is a flowchart of an example of a process 400 for manufacturing a light-emitting device by using the LED package body 100 and the 3D electroform stencil 310, according to aspects of the disclosure.

At step 410, the LED package body 100 is formed by molding the reflector cup 110 over the base 120. As noted above, when the reflector cup 110 is molded over the base 120, the protrusions 125 may become at least partially engulfed by the molding compound used to form the reflector cup 110, thereby strengthening the connection between the reflector cup 110 and the base 120. Furthermore, when the reflector cup 110 is molded over the base 120, the bridge member 115 may be formed between metal pads 123 and 124. As noted above, the bridge member 115 may help to electrically isolate the metal pads 123 and 124 from one another.

Figure 5:
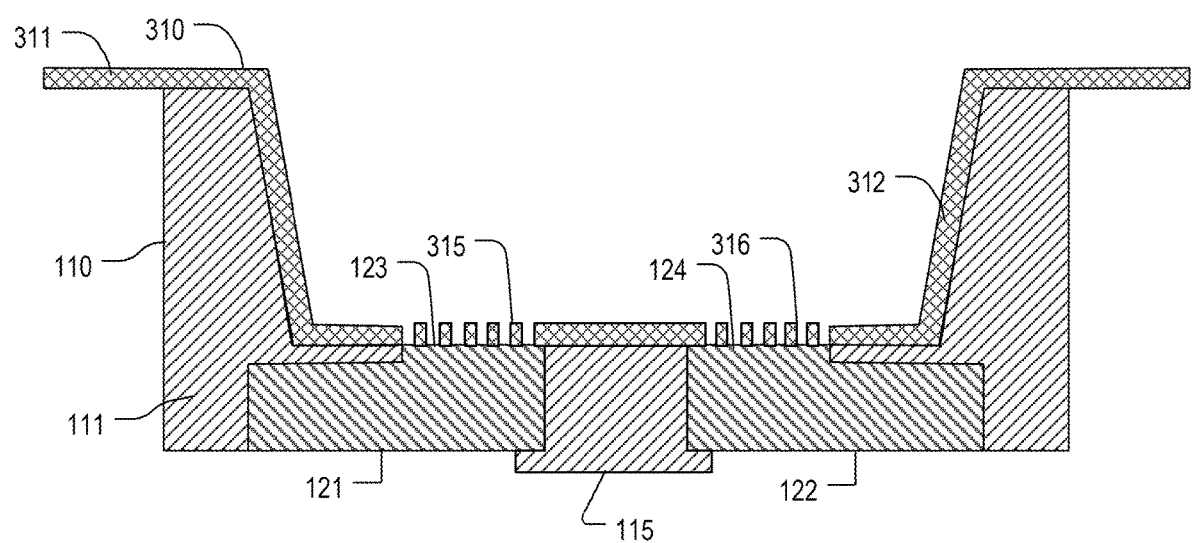
FIG. 5 is a diagram illustrating the performance of a step in the process of FIG. 4, according to aspects of the disclosure.

At step 420, the 3D electroform stencil 310 is inserted in the cavity 112 of the reflector cup 110. When the 3D electroform stencil 310 is inserted in the cavity 112 of the reflector cup 110, the reservoir 312 of the 3D electroform stencil 310 may be positioned inside the cavity 112 of the reflector cup 110, while the lips 311 of the 3D electroform stencil 310 engage the top surfaces of the sidewalls 111 of the reflector cup 110. FIG. 5 is a diagram showing the LED package body 100 with the 3D electroform stencil 310 inserted in the cavity 112 of the reflector cup 110. In this example, when the 3D electroform stencil 310 is inserted into cavity 112, the bottom surface of the reservoir 312 comes in contact with the bottom surface of the cavity 112. However, alternative implementations are possible in which the bottom surface of the reservoir 312 does not come in contact with the bottom surface of the cavity 112. In such instances, the bottom surface of the reservoir 312 may be suspended above the bottom surface of the cavity 112.

Furthermore, although in the present example, the shape of the reservoir 312 of the 3D electroform stencil 310 is conformal to the shape of the cavity 112 of the reflector cup 110, alternative implementations are possible in which the shape of the reservoir 312 of the 3D electroform stencil 310 is non-conformal to the shape of the cavity 112 of the reflector cup 110. For example, in some implementations, the reservoir 312 may have a U-shaped cross-section. In such instances, when the 3D electroform stencil 310 is inserted in the reflector cup 110, a bottom portion of the sidewalls of the reservoir 312 may come in contact with the sidewalls of the cavity 112, while a top portion of the sidewalls of the reservoir 312 remains separated from the sidewalls of the cavity 112.

Figure 6:
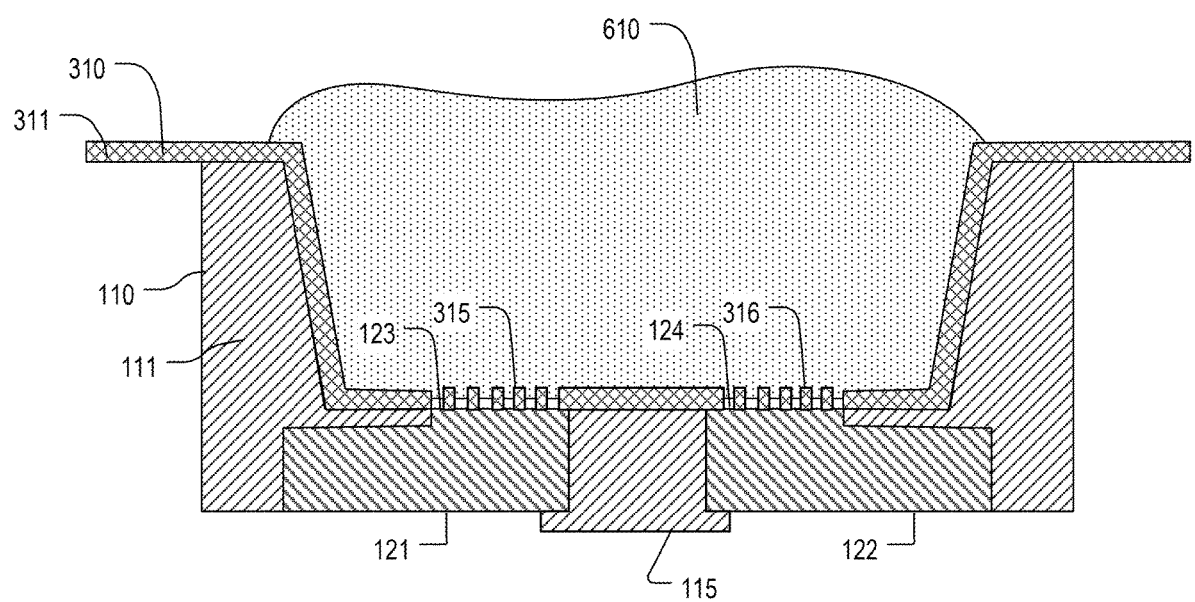
FIG. 6 is a diagram illustrating the performance of another step in the process of FIG. 4, according to aspects of the disclosure.

At step 430, the reservoir 312 of the 3D electroform stencil 310 is filled with solder paste. FIG. 6 is a diagram showing the 3D electroform stencil 310 after it is filled with solder paste 610. Although in the preset example, at step 430, the reservoir 312 of the 3D electroform stencil 310 is completely filled with solder paste 610, alternative implementations are possible in which the reservoir 312 of the 3D electroform stencil 310 is only partially filled with the solder paste 610. In some implementations, the solder paste 610 may include a gold-tin solder paste because of its high melting point, non-creep, high-tensile stress, thermal and electrical conductivity. However, alternative implementations are possible in which any other suitable type of solder paste is used instead.

Figure 7:
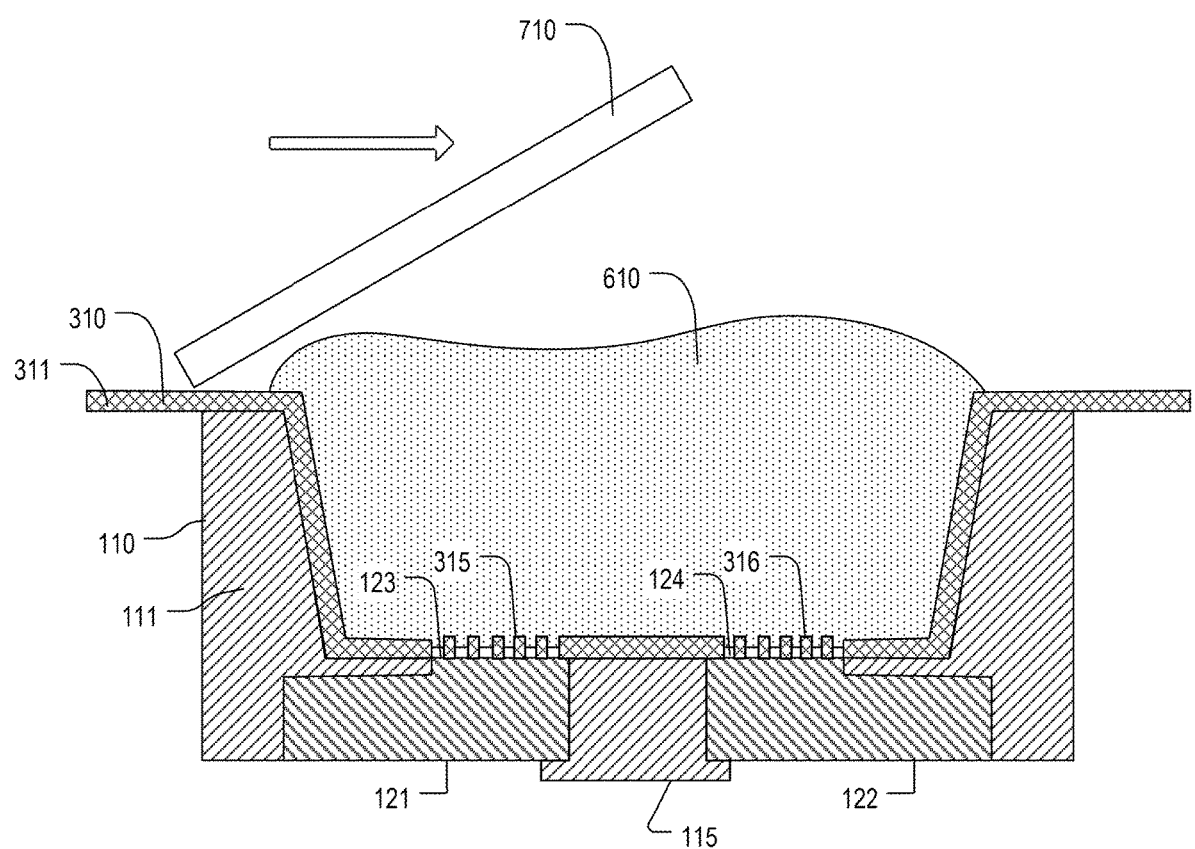
FIG. 7 is a diagram illustrating the performance of yet another step in the process of FIG. 4, according to aspects of the disclosure.

At step 440, at least some of the solder paste 610 in the reservoir 312 of the 3D electroform stencil 310 is driven through the apertures 315 and 316 that are present on the bottom of the reservoir 312. As illustrated in FIG. 7, at least some of the solder paste 610 may be driven through the apertures 315 and 316 by applying a pressure on the solder paste 610 with a squeegee 710. Although in the present example a squeegee is used to drive at least some of the solder paste 610 through the apertures 315 and 316 of the reservoir 312, alternative implementations are possible in which another technique is used instead. Stated succinctly, the present disclosure is not limited to any particular technique for driving the solder paste 610 through the apertures 315 and 316 of the reservoir 312.

Figure 8:
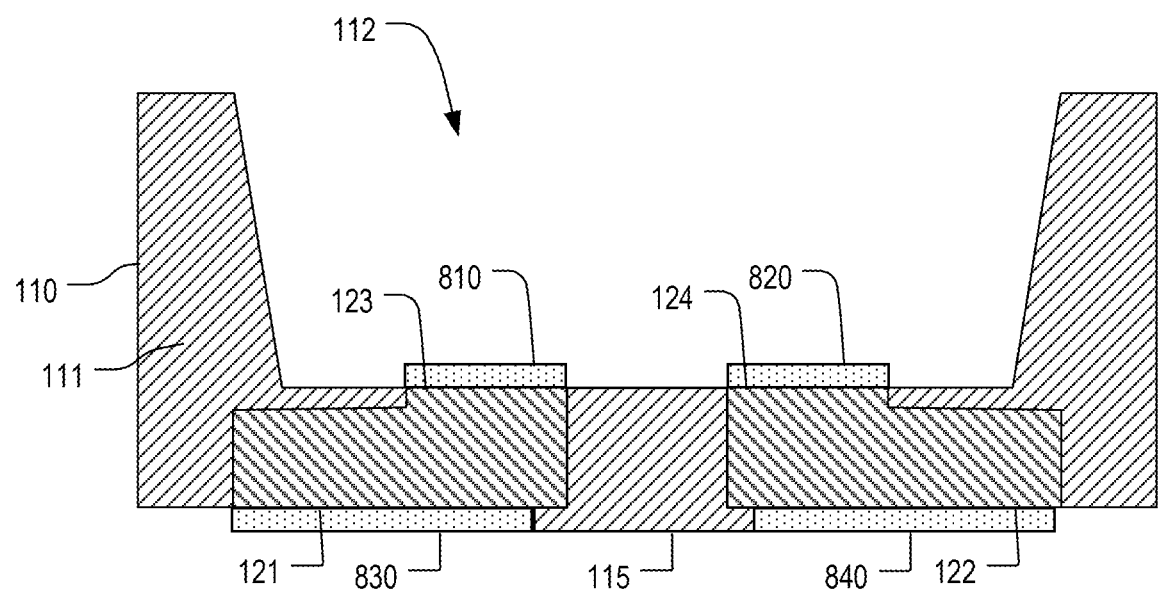
FIG. 8 is a diagram illustrating the performance of yet another step in the process of FIG. 4, according to aspects of the disclosure.

At step 450, the 3D electroform stencil 310 is removed from the LED package body 100. As illustrated in FIG. 8, when the 3D electroform stencil 310 is removed, solder patterns 810 and 820 are left behind on the metal pads 123 and 124. More particularly, the solder pattern 810 may be formed on the metal pad 123 and the solder pattern 820 may be formed on the metal pad 124, as shown. Each of the solder patterns 810 and 820 may include an array of dots or other shapes. Additionally, in some implementations, solder layers 830 and 840 may be disposed on the bottom surfaces of portions 121 and 122 of the base 120. Because the base 120 is formed of metal, the solder layer 830 may be electrically connected to the metal pad 123, and the solder layer 840 may be electrically connected to the metal pad 124. As can be readily appreciated, the solder layers 830 and 840 may be used to connect an LED die that will be disposed in the package body 100 to various electronic circuits.

Figure 9A:
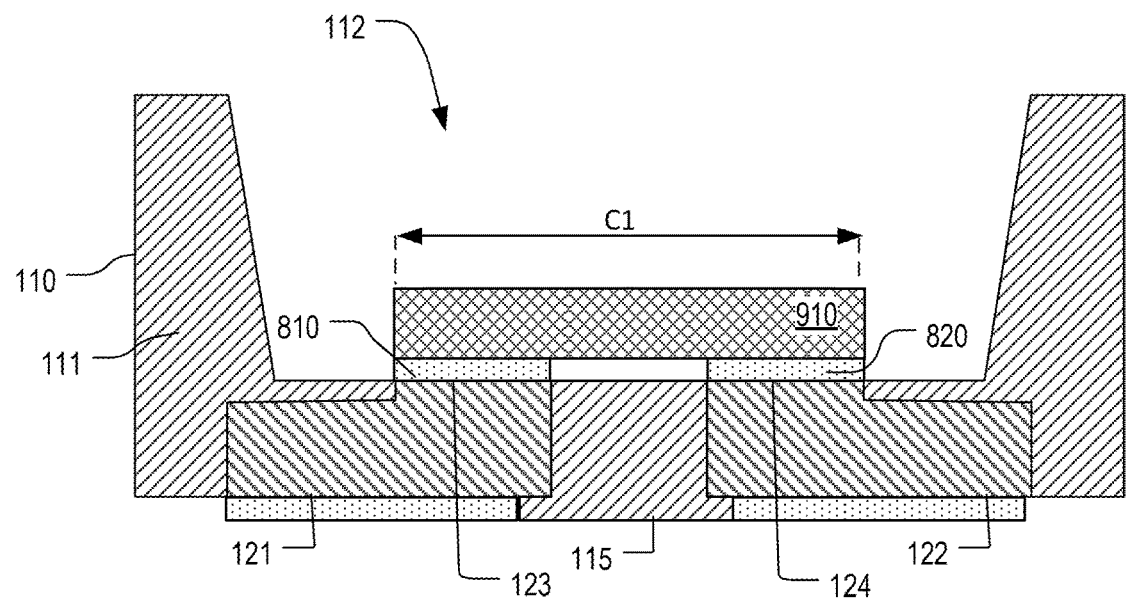
FIG. 9A cross-sectional side view of a light emitting device that is produced as a result of executing the process of FIG. 4, according to aspects of the disclosure.
Figure 9B:
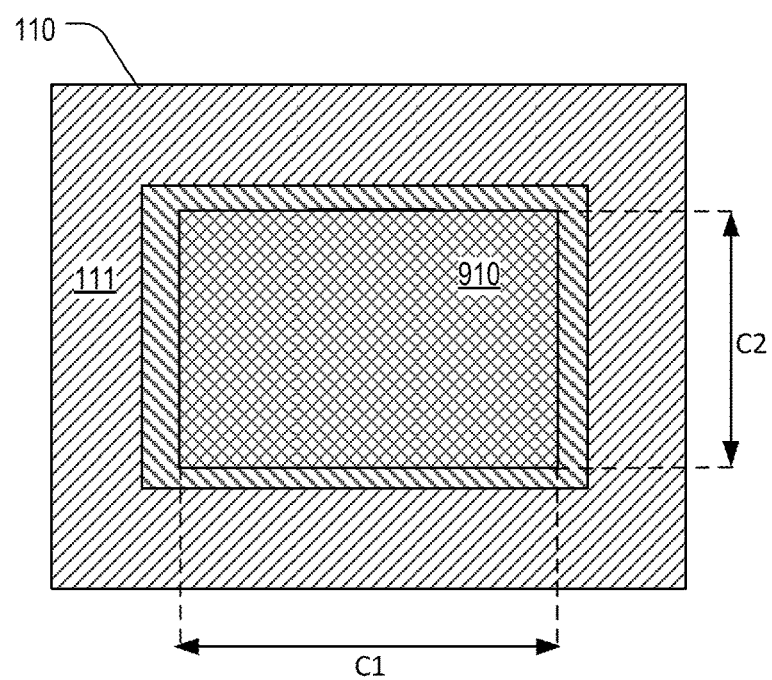
FIG. 9B is top-down view of the light-emitting device of FIG. 9A, according to aspects of the disclosure.

At step 460, an LED die is positioned over the solder patterns 810 and 820 and attached to the metal pads 123 and 124 by using solder reflow. More particularly, as illustrated in FIGS. 9A-B, an LED die 910 may be positioned over the metal pads 123 and 124, such that each of the contact pads of the LED die 910 (not shown) rests over a different one of the solder patterns 810 and 820. In some implementations, the LED die may include an active light-emitting layer that is sandwiched between a first conductivity layer and a second conductivity layer. The first conductivity layer and the second conductivity layer may be coupled to different contact pads of the LED die. Furthermore, the first conductivity layer, the second conductivity layer, and the active layer may be formed of any suitable material, such as a GaAs material or a GaN material, for example. In the present example, the LED die 910 is arranged in a flip-chip configuration. However, alternative implementations are possible in which the LED die 910 is arranged in another configuration. Stated succinctly, the present disclosure is not limited to any specific type of LED die being mounted inside the cavity 112 of the reflector cup 110.

As illustrated in FIGS. 9A-B, the LED die 910 may have a width C1 and length C2. The area of the bottom (or top) surface of the LED die 910 may be referred to as footprint of the LED die 910 and it may equal to the product of the width C1 and the length C2. In some implementations, the area of the top opening 113 of the cavity 112 may be larger than the footprint of the LED die 910 by 30% or less. For example, the area of the top opening 113 of the cavity 112 may be larger than the footprint of the LED die 910 by: 20% or less, 10% or less, or 5% or less. In comparison, a cavity's opening in a conventional reflector cup is about 80% larger than the footprint of the LED die that is installed in the conventional reflector cup.

FIGS. 1A-9B are provided as an example only. Although in the above examples, the 3D electroform stencil 310 includes only one reservoir, those of ordinary skill in the art would readily appreciate that alternative implementations are possible in which the 3D electroform stencil 310 includes a plurality of reservoirs that are spaced apart from one another. In such instances, the 3D electroform stencil 310 may be used to print solder patterns in multiple LED package bodies at the same time. More particularly, the 3D electroform stencil 310 may be placed over a plurality of integral package bodies, such that each reservoir is inserted in a different one of the package bodies. Next, solder paste may be disposed in each reservoir and used to form solder patterns in each of the package bodies. Next, a respective LED die may be mounted in each package body by using the solder patterns that are printed using the 3D electroform stencil 310. And finally, after a respective LED die is mounted in each package body, the package bodies may be separated from each other by using a saw and/or any other suitable cutting device.

Although some of the concepts disclosed herein are presented in the context of automotive lighting, it will be understood that the above-described LED package can be employed in any context. For example, the LED package can be used in indoor lighting systems, street lighting systems, stage lighting systems, decorative lighting systems, and greenhouse lighting systems. At least some of the elements discussed with respect to these figures can be arranged in different order, combined, and/or altogether omitted. It will be understood that the provision of the examples described herein, as well as clauses phrased as "such as," "e.g.", "including", "in some aspects," "in some implementations," and the like should not be interpreted as limiting the disclosed subject matter to the specific examples.

Having described the invention in detail, those skilled in the art will appreciate that, given the present disclosure, modifications may be made to the invention without departing from the spirit of the inventive concepts described herein. Therefore, it is not intended that the scope of the invention be limited to the specific embodiments illustrated and described.

What is being claimed is:

1. A method for manufacturing a light emitting device, comprising:
   providing a package body including: a reflector cup defining a cavity and a plurality of metal pads disposed at a bottom surface of the cavity;
   placing a reservoir of a 3D electroform stencil into the cavity of the reflector cup, such that a lip of the 3D electroform stencil engages a top surface of one or more sidewalls of the reflector cup, and the reservoir extends away from the lip and into the cavity;
   filling the reservoir of the 3D electroform stencil with solder paste;
   pushing the solder paste through one or more apertures that are formed on a bottom surface of the reservoir to deposit a respective solder pattern on each of the metal pads;
   placing an LED die on the solder patterns that are formed on the metal pads; and
   performing reflow soldering to attach the LED die to the metal pads.

2. The method of claim 1, wherein the reservoir includes a first group of apertures and a second group of apertures, the first group of apertures being formed at a first location in the bottom surface of the reservoir, and the second group of apertures being formed at a second location in the bottom surface of the reservoir.

3. The method of claim 1, wherein the reflector cup comprises a reflective silicone molding compound (SMC).

4. The method of claim 1, wherein the cavity has a depth of 4 mm or less.

5. The method of claim 1, wherein the cavity includes a top opening, the top opening being larger than a footprint of the LED die by 30% or less.

6. The method of claim 1, wherein the solder paste includes gold.

7. The method of claim 1, further comprising forming the 3D electroform stencil by using a mandrel that matches a shape of the cavity.

8. The method of claim 1, wherein top surfaces of the metal pads are positioned in a central portion of the bottom surface of the cavity.

9. The method of claim 1, wherein the 3D electroform stencil is formed at least in part of nickel.

\* \* \* \* \*